United States Patent
Dekervel et al.

(10) Patent No.: US 12,318,855 B2
(45) Date of Patent: Jun. 3, 2025

(54) METHOD FOR SOLDERING HEATING ELEMENTS TO CREATE AN ELECTRIC HEATING DEVICE OR A HEATING SOURCE; CORRESPONDING ELECTRIC HEATING DEVICE

(71) Applicant: THERMOCOAX, Caligny (FR)

(72) Inventors: Benoît Dekervel, La Coulonche (FR); Laurent Pichon, Vire (FR); Denis Lecharpentier, Putanges-le Lac (FR); Olivier Caillaud Gafsi, Conde sur Noireau (FR)

(73) Assignee: THERMOCOAX, Caligny (FR)

( * ) Notice: Subject to any disclaimer, the term of this patent is extended or adjusted under 35 U.S.C. 154(b) by 790 days.

(21) Appl. No.: 17/430,926

(22) PCT Filed: Feb. 16, 2020

(86) PCT No.: PCT/EP2020/053997
§ 371 (c)(1),
(2) Date: Aug. 13, 2021

(87) PCT Pub. No.: WO2020/165452
PCT Pub. Date: Aug. 20, 2020

(65) Prior Publication Data
US 2022/0126386 A1    Apr. 28, 2022

(30) Foreign Application Priority Data

Feb. 14, 2019    (FR) ........................ 1901501

(51) Int. Cl.
*B23K 1/00*    (2006.01)
*B23K 1/008*    (2006.01)
(Continued)

(52) U.S. Cl.
CPC ............ *B23K 1/0008* (2013.01); *B23K 1/008* (2013.01); *B23K 35/3033* (2013.01); *H05B 3/08* (2013.01);
(Continued)

(58) Field of Classification Search
CPC ........................ B23K 35/0244; B23K 1/0008; B23K 33/006; B23K 1/008; B23K 35/0233;
(Continued)

(56) References Cited

U.S. PATENT DOCUMENTS 3,110,795 A * 11/1963 Bremer .................... H05B 3/70
219/544
4,914,267 A * 4/1990 Derbyshire ....... B29C 66/81423
219/85.1
(Continued)

FOREIGN PATENT DOCUMENTS

JP    S59190468 U    12/1984
WO    2004/073032 A2    8/2004

OTHER PUBLICATIONS

International Preliminary Report on Patentability issued on May 31, 2021 in corresponding International Application No. PCT/EP2020/053997; 13 pages.
(Continued)

*Primary Examiner* — Eric S Stapleton
(74) *Attorney, Agent, or Firm* — Maier & Maier, PLLC (57) ABSTRACT

A method for creating an electric heating source, including a body equipped with one or more housings containing mineral-insulated heating cables. The housings communicate with one or more reservoirs which accept a purely metallic solder material in solid, powder or sheet form. The device is heated in a vacuum degassing plateau, followed by a casting plateau during which the solder melts and fills the housing around the heating cables, resulting in full metal
(Continued)

contact between the cables and the body, providing a more uniform temperature and a shorter response time to heating or cooling. Also, a heating source obtained in this manner, including an infrared faired source or an immersion heater for the heating of a liquid bath of molten metal.

22 Claims, 9 Drawing Sheets (51) Int. Cl.
  *B23K 35/30*  (2006.01)
  *H05B 3/08*  (2006.01)
  *H05B 3/28*  (2006.01)
  *B23K 101/14*  (2006.01)
  *B23K 101/36*  (2006.01)
  *H05B 3/76*  (2006.01)
  *H05B 3/78*  (2006.01)

(52) U.S. Cl.
  CPC ............ *H05B 3/28* (2013.01); *B23K 2101/14* (2018.08); *B23K 2101/36* (2018.08); *H05B 3/76* (2013.01); *H05B 3/78* (2013.01); *H05B 2203/005* (2013.01); *H05B 2203/017* (2013.01)

(58) Field of Classification Search
  CPC ............ B23K 35/3033; B23K 2101/36; B23K 2101/20; B23K 2101/14; H01L 21/68785; H01L 21/68792; H01L 21/67103; H05B 3/28; H05B 3/283; H05B 3/08; H05B 2203/017; H05B 3/78; H05B 3/76; H05B 2203/005
  USPC ...................................................... 219/444.1
  See application file for complete search history.

(56) References Cited

U.S. PATENT DOCUMENTS

| | | | | | |
|---|---|---|---|---|---|
| 5,053,595 | A | * | 10/1991 | Derbyshire | ......... B29C 66/8221 |
| | | | | | 219/634 |
| 5,107,095 | A | * | 4/1992 | Derbyshire | ........... B29C 66/861 |
| | | | | | 219/85.1 |
| 5,189,271 | A | * | 2/1993 | Derbyshire | ........... B29C 66/861 |
| | | | | | 219/634 |
| 2009/0280299 | A1 | * | 11/2009 | Ferrrato | ............... B23K 1/0012 |
| | | | | | 428/157 |

OTHER PUBLICATIONS

International Search Report issued on Jul. 3, 2020 in corresponding International Application No. PCT/EP2020/053997; 7 pages.

* cited by examiner

METHOD FOR SOLDERING HEATING ELEMENTS TO CREATE AN ELECTRIC HEATING DEVICE OR A HEATING SOURCE; CORRESPONDING ELECTRIC HEATING DEVICE

FIELD

The invention relates to a method for producing an electric heating source, comprising a body equipped with one or more housings containing mineral-insulated heating cables.

BACKGROUND

According to the invention, the housings communicate with one or more reservoirs which accommodate a purely metallic solder material in a solid, powder or sheet form. The device is heated in a vacuum degassing plateau, followed by a casting plateau, during which the solder melts and fills the housing around the heating cables. Full metal contact is achieved between the cables and the body, delivering an improved uniformity of temperature and a shorter response time to heating or cooling.

The invention also relates to a heating source thus obtained. In particular, it proposes the production of a heating plate for semiconductors, a faired infrared source for the execution of thermoplastic welding, or an immersion heater for the heat-up or maintenance of a melt bath.

Electric heating sources are employed in numerous fields, particularly in industry, for the achievement of temperatures of the order of 1,000° C.

Sources of this type may be employed for the heating of objects, either by contact through conduction, or without direct contact, by radiation or by gaseous convection.

A conventional method for producing a heat source of this type involves the use of a resistive electrical conductor carrying a high current. This is described as an "ohmic" source.

A linear "heating element" is produced accordingly, for example in a straight or curved shape, for example in the form of a conductor which is folded back on itself or wound in a closed circuit, in one or more loops.

In numerous applications, both with and without contact, the heating element also comprises an insulating jacket, which encloses the heating resistor, and an electrical insulator. This insulator is, for example, a ceramic powder or shell, thus constituting what is described as a "mineral-insulated cable".

In many cases, the insulator is also enclosed by a protective jacket, generally a leak-tight and high temperature-resistant metal layer, generally a layer of a nickel-based alloy, or the type marketed under the name "Inconel".

The linear configuration of these elements permits the latter to be formatted in a manner which is appropriate to the objects to be heated. They can even be incorporated directly in a volume of metal which has previously been provided with housings for this purpose.

A known application involves the production of an "immersion heater", with a rating of the order of 10 to 30 kW, which is employed for the maintenance of a metal bath in the molten state, for example an aluminum-tin-zinc-magnesium alloy at a temperature of approximately 800° C., for the casting of engine blocks or cylinder heads.

An immersion heater of this type is conventionally produced by the insertion of a heating filament in the interior of a ceramic "thermowell", wherein the remaining space is then filled with an electrical insulator in the form of an alumina, magnesia or boron nitride powder.

Another known application involves the production of an infrared source, at approximately 850° C., which is employed for the welding of thermoplastic parts. An infrared source of this type is brought to within a few millimeters of each plastic part to be welded in order to achieve a localized melting of the material, the heating source(s) are then removed, and the parts to be welded are compressed against one another in order to achieve the mutual welding thereof.

It is known for sources of this type to be produced in the form of a bare resistive wire secured to a ceramic support, or in the form of a heating resistor protected by a glass tube, or in the form of an unshielded mineral-insulated cable which is secured in a shaped aluminum support.

A further known application involves the production of a heating bed or heating plate, or "chuck", to which a semiconductor "wafer" is applied during part of the manufacturing process for electronic or photonic components.

A heating plate of this type is generally produced in the form of a disk, on the reverse of which spiral grooves are formed in which a mineral-insulated shielded heating cable is accommodated.

For heating up to 400° C., the plate is generally of aluminum construction, whether in plain form or in a sandwich construction with a counter-plate. Between 400° C. and 950° C. or higher, in a number of rare cases, the plate is of steel- or nickel-based alloy construction, or of ceramic construction. For temperatures in excess of 950° C., the plate is generally of ceramic construction. In this case, the heating element itself is formed of a conductive ceramic.

In the case of metal plates, the heating cable is fitted to the base of the groove, for example by a simple mechanically-supported peening method, or with an intermediate compound, as proposed in document WO200473032.

One object of the invention is to offset the drawbacks of the prior art, and particularly to improve the energy efficiency of sources of this type, to reduce their inertia in response to temperature changes, to improve their uniformity of temperature, to increase their reliability and their service life, to facilitate and enhance the reliability of their use, to simplify and reduce the cost of their manufacture and maintenance, and to improve potential compromises between these different criteria.

SUMMARY

According to the invention, all or part of these objectives is/are achieved by a method for producing an electric heating device, or heating source, of a type comprising at least one body which incorporates at least one housing for the accommodation of at least one mineral-insulated heating resistor (shielded or otherwise), which constitutes a linear heating element. This method comprises the following steps:

A step for the supply, or production, and preparation of a body comprising:
  at least one housing which accommodates said heating resistor, and
  one or more casting chambers or reservoirs containing a pure solder material, i.e. a material which is entirely fusible at the service temperature (conversely to mixtures incorporating a proportion of binder, which is then carbonized or gasified). This material is introduced as a solid, for example in a fragmented form such as a powder or a granular material, or potentially also in a monobloc form, such as in the form of a metal foil. These casting reservoirs communicate with said housing via one or more "casting" channels, which are arranged to permit said solder material, once melted, to pass through said casting channels and fill the space in said housing surrounding said heating resistor, by gravity and/or in response to a differential pressure and/or by capillary action.

A step for the heat-up of said body, particularly in a kiln, to a given temperature, in order to achieve the melting of said solder material.

The solder material is preferably constituted by a nickel-based metal alloy, particularly from the BNi family.

The heating element(s) typically incorporate exterior shielding. This shielding is preferably provided in the form of a steel-based alloy, particularly a stainless-steel alloy, for example of type 304L under the terms of the AISI standard (issued by the American Iron & Steel Institute).

This preference runs somewhat counter to customary practice in this area, which favors nickel-based alloys for reasons of durability, corrosion-resistance and high-temperature withstand at temperatures in excess of 400° C. and up to 800° C., or even higher. However, the inventors have observed that stainless steel-based shielding showed a superior behavior in this type of method. In particular, this shielding facilitates the adjustment of the melting time, in order to achieve a compromise between the completeness of the casting process and the resistance of shielding to contact with the liquid solder.

The heat-up step is preferably executed under a negative pressure, or even under a secondary vacuum, for example at a pressure lower than $10^{-2}$ mbar (10 microbar), if not lower than $10^{-3}$ mbar (1 microbar).

Alternatively or in combination, a pressure differential may also be generated in order to facilitate the casting process, for example by the insertion of a piston into the integrated casting reservoir, or into a casting reservoir which is temporarily fitted to the body.

More particularly, the heat-up step comprises the following:
 a preliminary degassing plateau, executed at a temperature which is lower than the melting temperature of the solder for at least 5 minutes, particularly between 700° C. and 900° C.;
 a casting plateau, executed at a temperature in excess of the melting temperature of the solder, ranging from 900° C. to 1,200° C. and specifically determined as a function of the composition of the solder, and of a duration determined in accordance with the mass to be heated, in order to achieve a temperature duration of at least 5 minutes, particularly of less than 20 minutes and, for example, of the order of 10 minutes.

According to a preferred particular feature, the solder material is arranged in the reservoir(s) in the form of a powder, for example in a quantity which represents a volume of powder determined as a function of the volume to be filled, at a ratio ranging from 1.2 to 2.0 times the volume to be filled, particularly where this ratio is calculated for a powder comprising between 20% and 45% voids.

According to another particular feature, the solder is introduced in the form of at least one metal part or metal foil, arranged in a volume which is situated above one or more casting channels, wherein said volume thus constitutes a casting reservoir.

According to a further preferred particular feature, the method disclosed here is characterized in that the housing(s) are produced to specific dimensions, according to the dimensions of the heating element(s), permitting a mutual clearance which ranges from 0.2 mm to 0.6 mm.

A particularly satisfactory compromise is thus achieved, which is sufficient to permit effective penetration of the solder, whilst promoting the circulation thereof by capillary action.

The method permits the achievement of the full continuity of metal, virtually free of bubbles or voids between the heating elements and the body. It thus permits an improved assembly of the body and the heating element(s). The latter are thus embedded in the liquid solder, which is in close and continuous contact, both with the heating elements and with the body. The solder fills voids, and thus replaces gaseous cavities with metallic material, over the totality of available surfaces. The result is thus a monobloc heating element, in the sense that it is comprised of a continuous metallic material in which the heating elements are directly embedded.

It will be understood that the presence of a reservoir permits the availability of a "reserve" of solder, as defined, for example, in the "Larousse" dictionary. Conversely to techniques involving the prior insertion of solder into the housing, it is thus possible for the housing to be supplied with a quantity of solder which is sufficient to fill the housing and to embed the heating element in solder.

Maximum thermal exchange is thus achieved, by full conduction between the heating elements and the constituent mechanical assembly of the body. The service life and the reliability thereof are also improved by the very fact of this metallic continuity. The thermal gradient between the body and the heating elements is reduced, thus permitting the achievement of a high temperature in the body with a moderate temperature of the heating elements. Energy efficiency is thus improved, together with the reliability and the service life of the heating source.

This optimized and continuous thermal exchange in all regions moreover permits the improvement of the uniformity of heating of the body, and thus the uniformity of its temperature. It also permits the acceleration of thermal transfers in time, and thus the reduction of response times associated with temperature adjustments. This facilitates the temperature setting and control processes, is conducive to the maintenance of a stable temperature over time, and permits rapid modifications to the temperature thus achieved.

Soldering permits effective thermal transfer, and thus a shallow thermal gradient between the heating element and the fairing. This permits the achievement of a high temperature on the fairing with a moderate temperature of the heating element, for example 900° C. on the fairing, with a heating element at a temperature lower than 1,000° C.

These different particular features are preferably mutually combined, but it is also provided that only certain of these features are to be deployed.

According to a further aspect, the invention proposes a heating device which is produced by a method of this type.

Heating Plate

According to a first category of forms of embodiment, the method is applied to the production of a heating plate, particularly of the type used for the manufacture, firing and/or treatment of a semiconductor wafer. The body comprises a flat support plate (possibly with localized contouring) which is designed to accommodate an object to be heated, in the thickness of which a plurality of linear housings are formed, which receive and surround the linear heating element(s) in a substantially complementary manner. This body incorporates one or more casting reservoirs, which communicate with said housings from a position which extends transversely to the plane of said support plate.

Typically, the support plate is of monobloc construction, and is initially in one piece.

According to a preferred particular feature, the support plate incorporates a functional region of oval, circular or polygonal shape. This functional region features:
- on one side, a support face which is designed to accommodate the wafer to be heated, and
- on the other side, an "internal" face, on the surface of which a plurality of grooves are cut which are substantially concentric to the functional region and, in particular, are circular or constitute one or more spirals.

The step for the production of the body then additionally comprises:
- the insertion of the heating element(s) into said grooves,
- the fitting and attachment on said internal face, particularly by leak-tight welding, of a counter-plate which closes said grooves, thus forming the housing(s) which enclose said heating elements.

According to a further preferred particular feature, preparation of the body includes the deposition of solder material in one or more casting reservoirs which are temporarily affixed to the counter-plate or forming a fixing base and/or infeed for the conductors of the heating elements.

According to a further preferred particular feature, the support plate is formed of a material which is selected from the following:
- an austenitic stainless steel,
- a martensitic stainless steel,
- a type 304 or 316 or 321 or 310 stainless steel, according to the AISI standard,
- a nickel-based alloy,
- a nickel-based alloy of the nickel-chromium type (particularly in the category sold under the name "Inconel"),
- a titanium metal or alloy, or
- a copper-based alloy.

The invention thus proposes a heating device constituting a heating plate which is produced by a method of this type, in which the support plate incorporates at least two independent heating elements.

More particularly, this heating device comprises at least one "interior" heating element, forming at least one spiral, and at least one "peripheral" heating element, forming a circular loop or a number of spiral loops, which surrounds said interior heating element, particularly in a planar arrangement, and which are parallel to the support surface and, for example, mutually coplanar.

Metal heating plates of this type are capable of achieving high temperatures, for example of the order of 900 to 950° C., whilst ensuring exceptionally good thermal uniformity. These heating plates are employed in vacuum deposition machines, for example of the PVD, CVD or ALD type, as a heated substrate carrier for the production of semiconductors.

This optimization of thermal uniformity permits the improvement of the reliability, the performance capabilities and the possibilities delivered by these machines. This can permit, for example, the improvement of the uniformity of thickness of a thin layer which is deposited on the plate, which is associated with the thermal uniformity of the heating plate. This permits, for example, the etching of finer transistors (for example of thickness less than 10 nm), thereby reducing their energy consumption and permitting a greater density of integration.

These improvements also provide a facility for the deposition of further conductive or insulating materials, which are directly associated with the availability of an extended temperature range on the heating plate, particularly high temperatures, for example on one and the same heating plate.

These different particular features are preferably mutually combined, but it is also provided that only certain of these features are to be deployed.

Infrared Source

According to a second category of forms of embodiment, the method is applied for the achievement of a faired infrared source, particularly for the welding of one or more thermoplastic parts. The body thus comprises at least one linear or two-dimensional "fairing" part, incorporating one "functional" surface, the shape of which is defined in order to produce a weld bead in the form which said heating source is intended to produce, for example a linear shape which spatially follows the shape of the linear weld bead to be produced, or a two-dimensional region which reproduces the shape of a region of the weld to be produced.

In these forms of embodiment, said fairing part incorporates, in its thickness, one or more linear grooves which accommodate and surround the linear heating element(s) in a substantially complementary manner; the body comprises one or more casting reservoirs, which communicate with said housings from a position which extends transversely to the plane of said support plate.

In particular, it is provided that fairing is produced, the shape of which differs from that of the heating element(s), i.e. the outline of which is not homothetic with the outline of the heating element or a group of heating elements. It is thus easier to select the exact shape of the zone to be heated, independently of constraints associated with the linear form, the dimension and/or potential radii of curvature of the heating element(s) employed.

According to a preferred particular feature, the fairing part incorporates one or more grooves which surround the heating element(s), on a different surface, described as the "internal" surface, which faces in a different direction to the functional surface, and is typically an opposing surface to the functional surface. The opening of these grooves, i.e. the region in which they emerge transversely to the internal surface, receives the solder material prior to the casting step, typically by the deposition thereof in these openings when they are directed upwards. The solder material thus castings into the grooves during the casting step, wherein these grooves thus constitute the housing in which the solder material secures or embeds said heating elements, preferably by the total or partial coverage of the heating elements.

According to a further preferred particular feature, at least one fairing part is produced by a direct metal laser additive manufacturing process, or "direct metal laser sintering", primarily employing a cobalt-chromium alloy, specifically comprising between 60% and 65% cobalt and between 26% and 30% chromium.

According to a further preferred particular feature, the heating element(s) selected have an external diameter equal to or less than 2 mm.

A low thermal inertia is thus achieved, which is facilitated by a quality of heat transfer which permits the substantial dissipation of power, with no excessive overheating of the heating element.

Typically, a regulating thermocouple is also soldered directly to the heating element, and is preferably also embedded in the liquid solder pool which is produced by the heat-up of the melt material, for example between the heating element and the wall of its housing. Soldering permits an effective heat transfer, and thus increases the accuracy of measurement. The diameter of thermocouples is preferably less than 2 mm which, in combination with the small diameter of the heating elements, permits a reduction of the thermal impact upon the source, thus permitting the achievement of a short response time.

Soldering permits an effective heat transfer, and thus a shallow thermal gradient between the heating element and the fairing. This permits the achievement of a high temperature on the fairing, with a moderate temperature of the heating element, for example 900° C. on the fairing, with a heating element at a temperature lower than 1,000° C.

By the improvement of heat transfer, and the uniformity thereof over the full fairing, it is possible to achieve a fairing with the closest possible match to the shape of the weld bead, thus overcoming any constraints of shaping associated with the heating elements. It is thus possible to achieve greater dimensional accuracy of the infrared source, thereby reducing variations in distance and lateral position between the source and the bead, and thus improving the consistency of the heat-up of the weld bead.

The dimensional accuracy of sources is dependent upon the fairing, as the heating element is inserted in the interior of the latter. Fairings obtained by an additive manufacturing process, in particular, delivers high accuracy, but also a low residual stress factor, such that the dimensions and behavior thereof in response to expansion are very close to theoretical values, thus delivering a high degree of reliability and predictability.

The choice of cobalt-chromium for the fairing material provides particularly good resistance to the corrosive and abrasive properties of welded plastics or their additives. This material moreover provides mechanical robustness, which extends service life and facilitates cleaning, wherein this combination permits the improvement of service life in mass production.

These different particular features are preferably mutually combined, but it is also provided that only certain of these features are to be deployed.

Immersion Heater

According to a third category of forms of embodiment, the method is applied to the production of an immersion heater, particularly for the maintenance of temperature of a liquid bath, particularly of molten metal.

In these forms of embodiment, the body comprises a casing which is designed to be totally or partially immersed in the liquid to be heated, incorporating a housing which is enclosed in a leak-tight manner vis-à-vis said liquid, i.e. by the constituent wall of the casing, and in those parts which are in contact with the liquid, according to the intended configuration of immersion. This housing incorporates one or more linear insertion channels, which receive and enclose the heating element(s) in a substantially complementary manner, and featuring at least one insertion end for the introduction of the heating elements. Moreover, the casting reservoir(s) are formed by the extension of said insertion ends, or are connected to said insertion ends.

The casing typically comprises or constitutes a "well", terminating at one end which constitutes the insertion end. The well accommodates a heating element, all the connections of which are located at the same end of the heating element, and are led out from the body via the same insertion end of the well.

According to a preferred particular feature, the casing which constitutes the body comprises a shell of a ceramic base material, particularly of the silicon nitride, silicon carbide or aluminum oxide type, which forms a leak-tight barrier between the insertion channel and the liquid to be heated.

BRIEF DESCRIPTION OF THE DRAWINGS

Further particular features and advantages of the invention proceed from the detailed description of one form of embodiment, which is not provided by way of limitation, and from the attached drawings, in which:

FIGS. 2 to 9 illustrate a first exemplary form of embodiment of the invention, involving a heating plate for the treatment of semiconductor wafers:

FIGS. 10 to 14 illustrate a second exemplary form of embodiment of the invention, involving an annular infrared source for the welding of thermoplastic materials:

FIGS. 16 to 18 are longitudinal section diagrams illustrating a third exemplary form of embodiment of the invention, involving an immersion heater for the maintenance of the temperature of a melt bath:

DETAILED DESCRIPTION

Heating Plate

Figure 1:
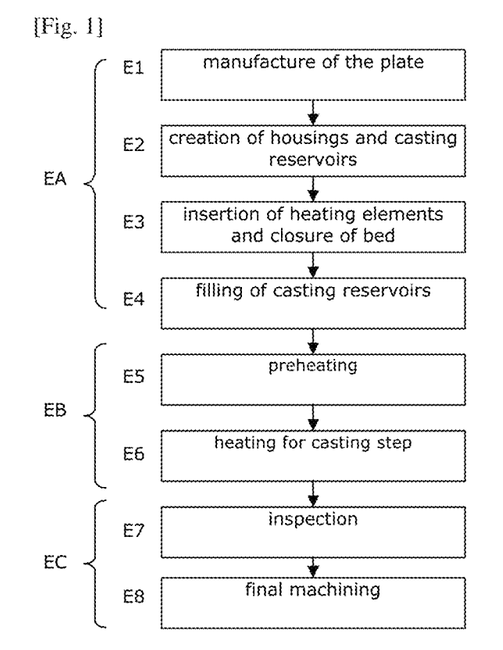
FIG. 1: shows an organigram which illustrates production steps of the method, according to an exemplary form of embodiment.

FIG. 1 illustrates production steps of the method, according to a preferred form of embodiment. FIGS. 2 to 6 provide a more detailed illustration of the application of this method in a first exemplary form of embodiment of the invention, involving a heating plate 1 for the treatment of semiconductor wafers.

The method involves the production of an electric heating device or heating source, of a type comprising at least one body 11 incorporating at least one housing 190 which encloses at least one mineral-insulated heating resistor (shielded or otherwise), forming a linear heating element 191.

As illustrated in FIG. 1, in a preferred form of embodiment this method comprises the following steps:

EA: supply, or production, and preparation of a body comprising:
  at least one closed housing, which encloses said at least one heating resistor, and
  one or more casting chambers or reservoirs 180 containing a solder material 8 in powdered form.

This reservoir communicates with said housing via one or more "casting" channels 181, wherein said reservoirs are arranged to permit said solder material, once melted, to pass through said casting channels and fill said housing 190 around said heating resistor 191, by gravity and/or in response to a differential pressure and/or by capillary action;

EB: heat-up of said body, particularly in a kiln, to a specific temperature, in order to achieve the melting of said solder material 8.

In greater detail, step EA comprises the following operations, preferably, but not necessarily, in the following order:

E1: production of the body (in this case: the plate 111 and the counter-plate 112), E2: formation of the housings 190 and of the casting reservoir(s) (in this case: the base 13 and its interior 180)

E3: insertion of the heating elements (191, 192) and thermocouples (71, 172);

if necessary, closure of the bed by welding 1119,

E4: filling of the casting reservoirs 180 with the powdered solder material 8, in a specific quantity required to ensure the filling of all accessible volumes within the housings 190, between the heating elements 191, 192 and the body (the bed 11), and between the thermocouples 171, 172 and the body.

The heat-up step EB comprises the following operations:

E5: preheating in a kiln, for the achievement of a uniform temperature within the entire assembly, to a temperature which is lower than the melting temperature of the solder material. Optionally, preheating incorporates a degassing plateau, which is executed under a secondary vacuum, either throughout or during a final part of preheating.

E6: casting heating, to a temperature which exceeds the melting temperature of the solder material, for a specific time period, in order to permit the filling of all accessible volumes within the housings, between the heating elements and the body. Melting is executed under a secondary vacuum, i.e. at a pressure lower than $10^{-3}$ mbar (1 microbar).

The method further comprises a post-casting step EC. This particularly comprises, either in this order or in another order:

E7: a control step, comprising a heat-up test to the service temperature, or close to the service temperature, and including a temperature uniformity control.

E8: a finishing step, particularly involving re-machining for the achievement of the requisite dimensional tolerances.

a preliminary degassing step E5, executed at a temperature below the melting temperature of the solder for at least 5 minutes, particularly in excess of 750° C. and/or below 850° C.;

a casting plateau E6, executed at a temperature in excess of the melting temperature of the solder, and of a specific duration, according to the mass to be heated, in order to achieve a sustained temperature for at least 5 minutes and, for example, for less than 30 minutes.

According to a particular feature, the preliminary degassing plateau E5 is executed, for example, at a temperature close to 800° C., to a margin of 20° C. or even 10° C., and for a duration of the order of 15 minutes.

According to a further particular feature, the casting plateau E6 is executed, for example, at a temperature between 940° C. and 1,040° C. for a duration of the order of 10 minutes.

The solder material 8 constitutes a nickel-based metal alloy, in this case selected from the BNi family.

The heating element(s) 191, 192 incorporate exterior shielding in the form of a steel-based alloy, in this case stainless steel, for example of type 304L under the terms of the AISI standard (issued by the American Iron & Steel Institute).

The solder material is arranged in the reservoir(s) in the form of a powder, in a quantity which represents a volume of powder determined as a function of the volume to be filled, at a ratio ranging from 1.2 to 2.0 times the volume to be filled, where this ratio is calculated for a powder comprising between 20% and 45% voids.

The housing(s) are preferably produced to specific dimensions, according to the dimensions of the heating element(s), permitting a mutual clearance which ranges from 0.2 mm to 0.6 mm between the exterior surface of each heating element and the wall of the housing which accommodates the latter. A particularly satisfactory compromise is thus achieved, which permits the achievement of sufficient enclosure, whilst promoting the casting of material by capillary action.

Figure 2:
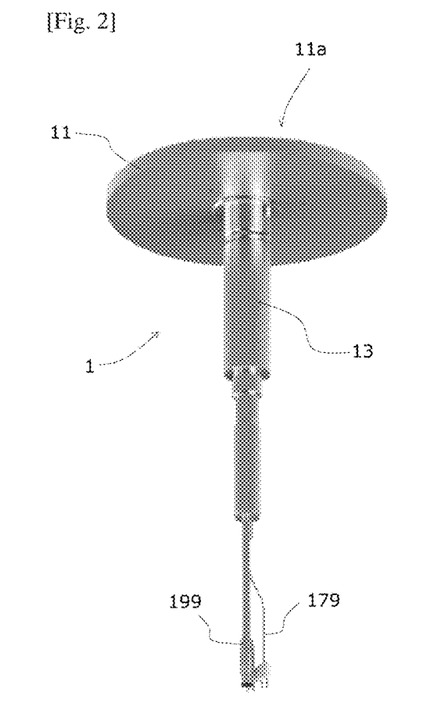
FIG. 2: shows a perspective photo illustrating a finished heating plate, according to the first exemplary form of embodiment.

FIG. 2 illustrates an example of a heating plate 1 of this type. It comprises a body 11 which constitutes a bed, in this case a circular bed. The support surface 111a of this bed 11 is generally flat, and is employed as a work surface for the production of semiconductors.

According to requirements, this bed may incorporate the various known devices and arrangements, whether in whole or in part. For example, it may be traversed by air intake ducts, which permit the maintenance of the semiconductor wafer on the support surface by means of aspiration via these ducts. The bed may also incorporate a cooling system of a known type or, for example, a tubular or channel system. Holes may also be provided for the accommodation of a mobile support system for the wafer, described in English as "lift spin". The surface of the bed may also be provided with an anti-slip channel, or with "gas line" protection, to protect the edge of the wafer which overshoots the bed against deposition.

On its opposite side, which faces downwards during use, the bed 11 is secured to a base 13, in this case in the center of the bed. This base, which may not be present in other versions, depending upon requirements for the production machine concerned, is employed here as a fixing support for the bed, and protects the various electrical conductors 199, 179 which are routed to the bed 11. The device 1 is illustrated here with a central base 13, but may also be executed differently, with lateral bases or with no base at all, in which case a direct outlet is arranged on the underside of the bed.

Figure 3:
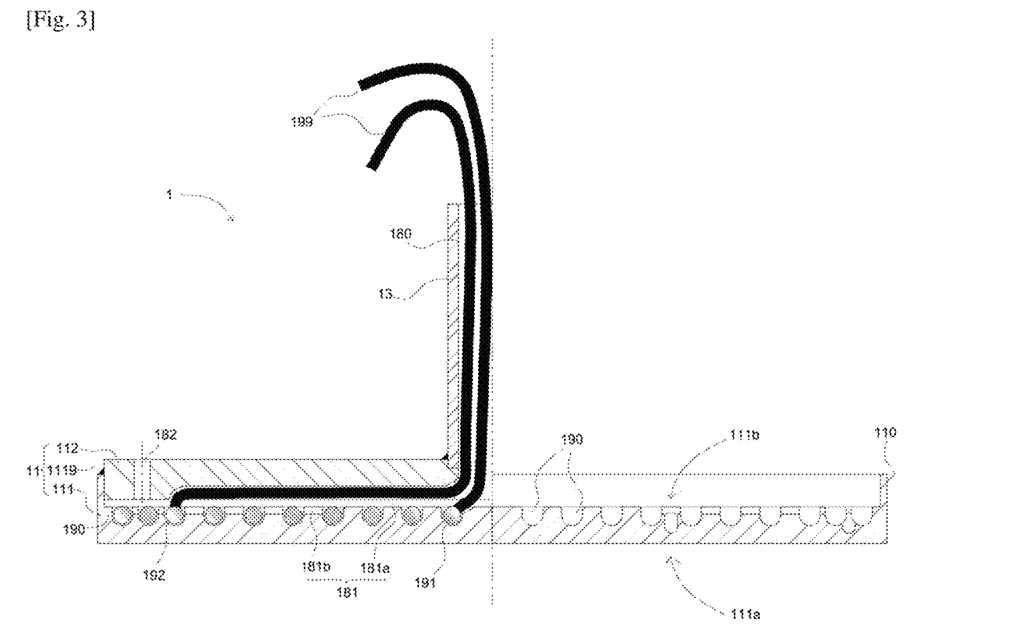
FIG. 3: shows a sagittal section diagram, illustrating a production step for the heating plate according to FIG. 2, FIG. 4: shows a similar diagram illustrating a subsequent step.

FIGS. 3 to 6 illustrate certain production steps in greater detail, according to a preferred version. FIG. 3 illustrates the heating plate 1 in an inverted position, in order to permit a casting by gravity. The bed 11 is already provided with its housings 190, which are formed in a support plate and in which the heating elements are inserted, in this case two linear heating elements 191 and 192 which can be controlled in a mutually independent manner from one another. The housings are constituted, for example, by grooves which are machined into the support plate 111, and which run along its internal surface 112a.

In a preferred version illustrated here, the support plate 111 comprises two independent heating elements 191, 192, i.e. which are capable of being controlled in an independent manner from one another. Optionally, the bed may comprise only a single heating element, or may comprise more than two, for example three or four heating elements.

Figure 9:
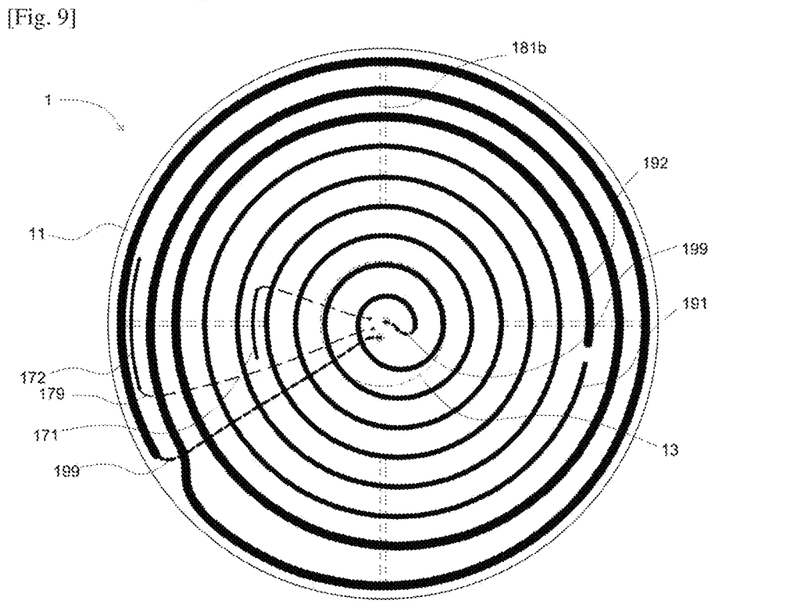

FIG. 9 illustrates a preferred example of the arrangement of heating elements. A first interior heating element 191 forms a spiral with a plurality of turns, in this case about its point of origin at the center of the bed 11. A second peripheral heating element 192 forms a circular or oval loop (or, optionally, a plurality of spiral loops) which surrounds the interior heating element 191. In the present example, the two heating elements are each arranged in a parallel plane to the support surface 111a, and are mutually coplanar.

By the separate and differing control of the two heating elements 191 and 192, it is thus possible to execute the separate regulation of heating in the central region and the peripheral region, for example to take account of their mutually differing thermal losses. It is thus easier to achieve a uniform temperature over the entire support surface 111a of the bed.

In the present example, the bed 11 further comprises optional thermocouples 171, 172, which themselves are inserted in housings within the support plate 111 and are preferably embedded by casting. They permit localized temperature control, and the adjustment of heating by the various heating elements 191, 192.

The heating elements and thermocouples are powered and connected by means of conductors 199 and 179 respectively. According to the position of the heating elements and thermocouples, their conductors may traverse the bed via a radial groove 181a in the counter-plate 112. They exit, for example, via the base 13, in this case traversing the casting reservoir 180.

As illustrated in FIG. 3, in a preferred version and regardless of the number of heating elements, a counter-plate 112 is fitted to the internal surface 111b of the support plate 111, and thus closes the housings 190. The counter-plate 112 is welded 1119 to the support plate 111 in a leak-tight arrangement over its entire perimeter and, in this case, is fitted thereto by interlocking with a flange 1110, constituting a skirt which projects from the support plate about its internal surface 111b.

Clearance between the support plate 111 and the counter-plate 112 is calibrated exactly by means of bosses which project from the surface of one or other thereof, the thickness of which is determined to ensure the requisite clearance around the heating elements 191, 192 in their housings 190. The dimensions of the two plates are preferably adjusted such that a flatness tolerance not exceeding 0.6 mm is achieved between the latter.

In this case, the device 1 comprises a single casting reservoir which is formed, for example, by a space 180 arranged in a vertical cylinder which projects upwards and forms a base 3. Alternatively, or in combination, a number of casting reservoirs may be employed, for example welded in different positions above the bed, possibly on a temporary basis.

As can be seen from the figure, the casting reservoir 180 constitutes a separate volume from the housing 190, with which it communicates via an opening which is narrow in comparison with the greatest cross-section of the housing which is to be filled. This reservoir thus extends in a perpendicular direction to said greatest cross-section.

The casting reservoir 180 communicates with the various housings via casting channels. By way of an example, in this case, said casting channels comprise a space 180 which is arranged between the counter-plate 112 and the top of the heating elements, together with the internal surface 111b of the support plate 111. Alternatively, or in combination, they may also comprise grooves 181b which interlink the different housings, in this case in a radial arrangement.

The right-hand section of the figure illustrates the support plate 111 only, with its housings 190, but prior to the insertion of the heating elements 191, 192 and the closure of the housings by the counter-plate 112.

The left-hand section of the figure illustrates the bed, with its heating elements and thermocouples in place, already closed and fitted to its base 13, for example by welding.

Figure 4:
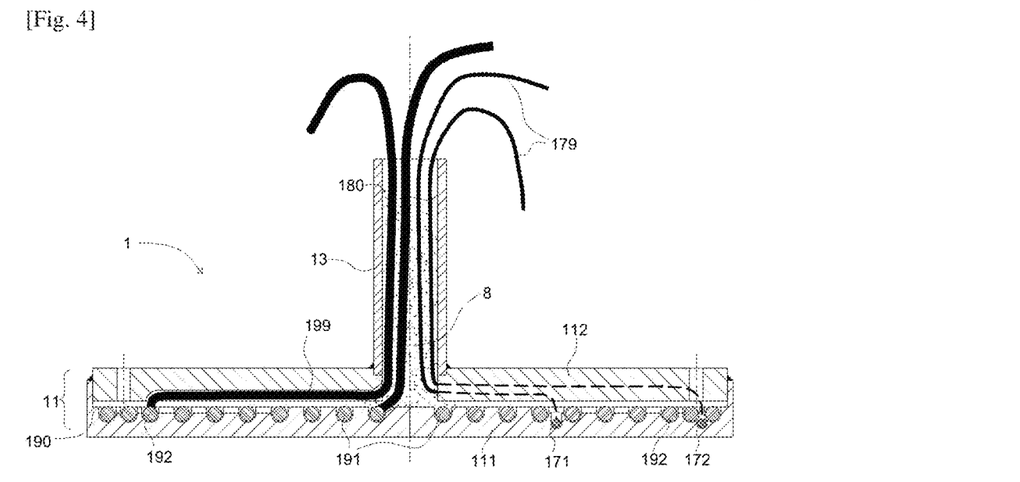

As illustrated in FIG. 4, once the assembly is complete and leak-tight, solder material 8 is inserted into the casting reservoir 180 in powdered form.

Figure 5:
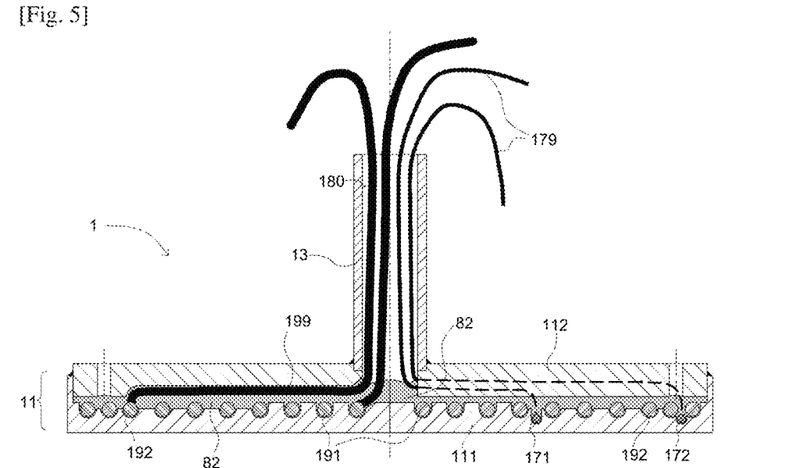
FIG. 5: shows a similar diagram illustrating a subsequent step.

As illustrated in FIG. 5, further to the degassing E5 and the heat-up of the melt material E6, the powdered solder 8 has melted and filled the casting channels 181 and the housings 190, in this case by gravity only, thus constituting a continuous material element 82 which embeds the heating elements 191, 192 in the material of the bed 11. This solder 82 thus permits the secure fixing of the heating elements, and provides continuous material contact thereof with the plate 111 of the bed 11, thus delivering excellent thermal conduction.

Figure 6:
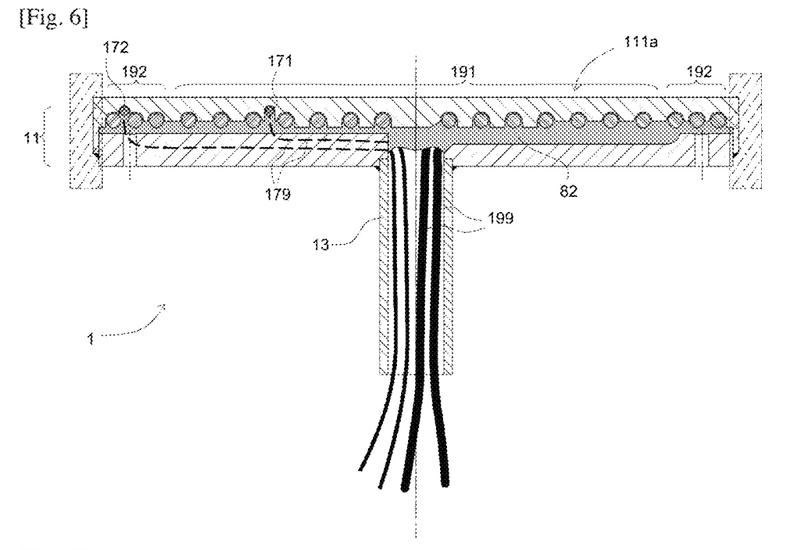
FIG. 6: shows a similar diagram illustrating a subsequent step.

FIG. 6 represents the heating plate 1, restored to its operating position, for example for inspection and finishing. The dash-dotted lines on either side illustrate the peripheral zone of the bed, which will be removed in the final machining step, and incorporating in this case the positioning skirt 1110.

Figure 7:
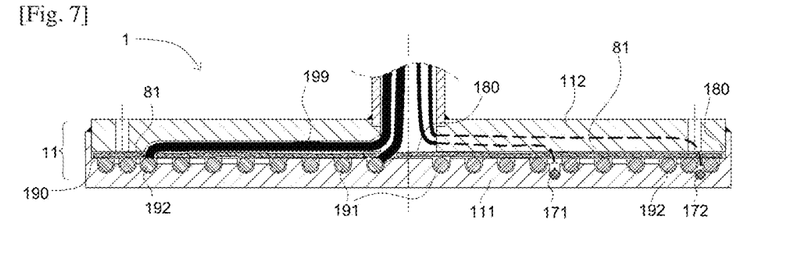
FIG. 7: shows a diagram illustrating an alternative to FIG. 4, FIG. 8: shows a diagram illustrating an alternative to FIG. 5, FIG. 9: shows a diagram in an axial view, illustrating the routing of heating elements within the bed of the heating plate.
Figure 8:
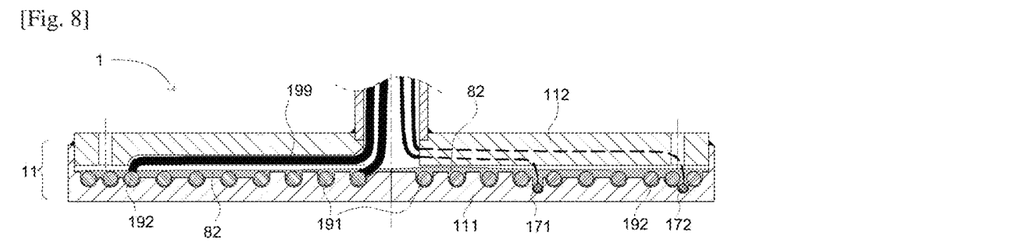

FIGS. 7 and 8 illustrate an alternative, in which the solder is introduced in the form of one or more metal foils 81. These metal foils are selected with a specific thickness, in order to deliver the requisite volume for the filling of the housings 190 between the heating elements and the bed. They are arranged in the volume situated between the bed 111 and the counter-plate, above the casting channels 181, 181a, such that the latter are covered.

They are trimmed, as required, to ensure the coverage of all the casting channels. FIG. 7 illustrates the pre-casting step, where the foil 81 is in place and the bed is closed. FIG. 8 illustrates the post-casting step, where the melted solder 82 has embedded the heating elements by engaging with the walls of the grooves 190.

Optionally, these foils may incorporate a part which is arranged in the interior of the grooves which constitute the housings 190, and which is thus interposed between the bed 111 and the heating elements 191, 192. This part is preferably of a thickness which is smaller than the definitive spacing to be achieved between the heating elements and the walls of their housing/groove 190. Preferably, another part of these foils projects beyond, or is arranged above, the housings 190, in the volume which constitutes the casting reservoir 180, in order to deliver a total quantity of solder which is sufficient to ensure the filling of the housings.

Faired Infrared Source

FIGS. 10 to 14 illustrate a second exemplary form of embodiment of the invention, which will only be described with respect to its differences. In this example, the heating source 2 is an infrared source for the welding of thermoplastic materials.

Figure 10:
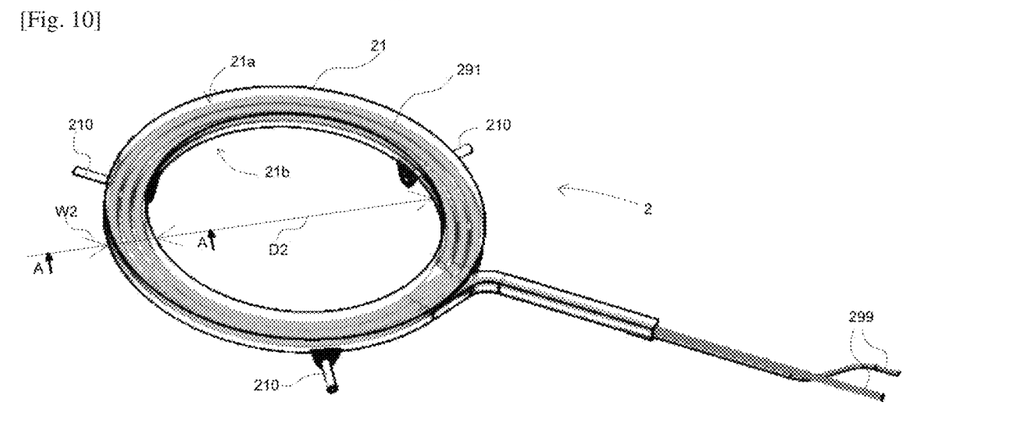
FIG. 10: shows a perspective view illustrating the infrared source and its heating element, shown in a transparent view.

As illustrated in FIG. 10, the infrared source comprises a body 21, the shape of which corresponds to the weld which it is to execute: in this case, an annular bead of width W2 and internal diameter D2. This body incorporates fixing lugs 21, which permit the fixing thereof in its service position. This body 21 forms a fairing element, having a functional surface 21a, which is continuous over the entire emission zone. In this example, this functional surface 21a is a flat surface which, in FIG. 10, is illustrated facing upwards.

Figure 11:
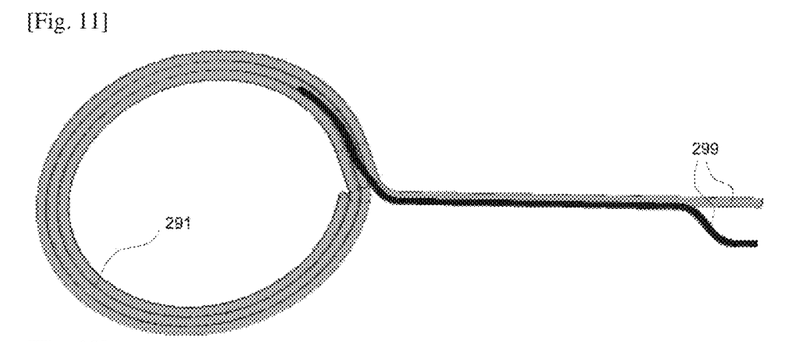
FIG. 11: shows a perspective view for the separate illustration of the heating element, in the form which it assumes in the interior of the infrared source.

This fairing 21 is heated by a linear heating element 291, supplied by conductors 299, illustrated in isolation in FIG. 11. This heating element 291 is secured to an "internal" surface 21b of the fairing, opposite the functional surface 21a and, in this case, is wound on said internal surface in a spiral having three turns.

Figure 12:
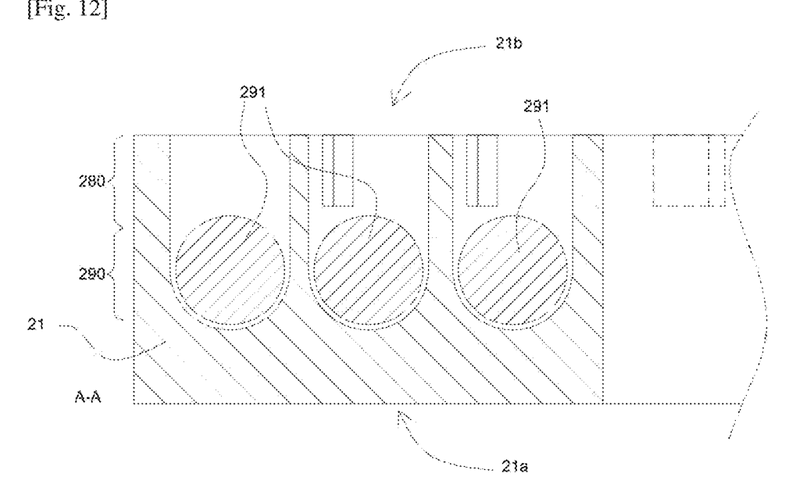
FIG. 12: shows a transverse sectional view of part of the annular part of the source, which illustrates a production step.
Figure 13:
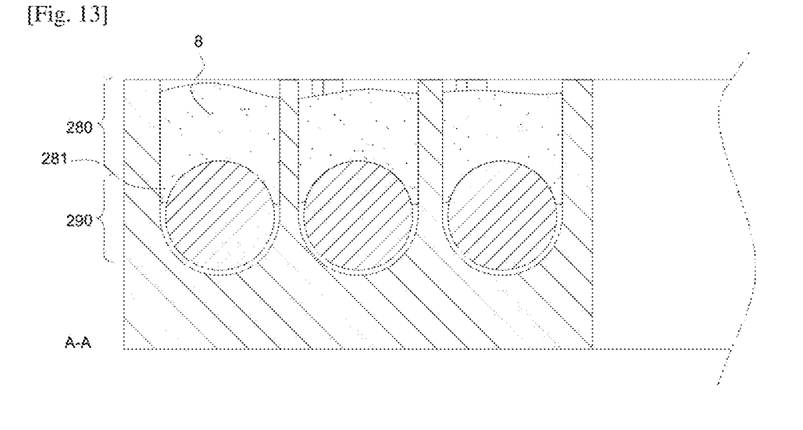
FIG. 13: shows a similar illustration of a subsequent step to FIG. 12, FIG. 14: shows a similar illustration of a subsequent step to FIG. 13, FIG. 15: illustrates an alternative to FIG. 13.
Figure 14:
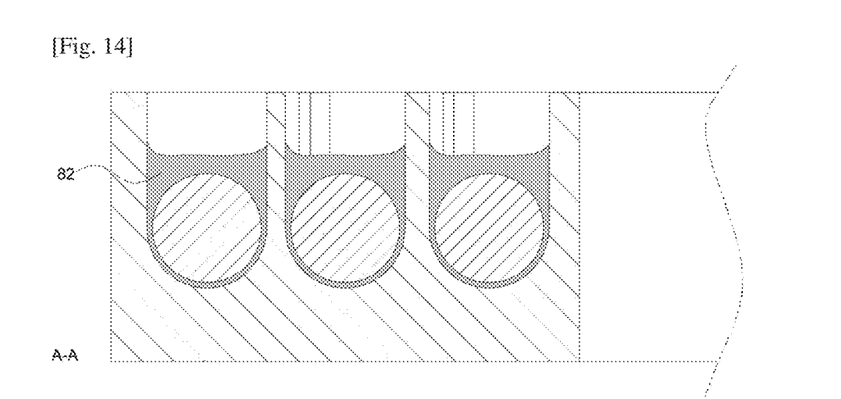

The fairing 21 is illustrated in FIGS. 12 to 14, in a partial sagittal sectional view at the section line AA indicated in FIG. 10.

FIG. 12 illustrates the fairing with the heating element 291 in place. In this case, the functional surface 21a is flat, and is turned to face the bottom of the figure. The internal surface 21b, on the opposite side, incorporates three grooves, which are mutually parallel, and parallel to the path of the weld bead, arranged here in a spiral. The base of each groove thus constitutes the housing 290 which accommodates the linear heating element 291. The depth of the groove is greater than the diameter of the heating element 291, and leaves a space above the latter which is enclosed by the walls of the groove. This space thus forms a trench, which constitutes a casting reservoir 280.

As illustrated in FIG. 13, the powdered solder 8 is then introduced into this trench 280 via the longitudinal opening of the groove. In this form of embodiment, the powdered solder fills the opening of the housing, which can thus be considered to be closed around the heating element.

As illustrated in FIG. 14, further to the heat-up step EC and the casting step E6, the solder has been melted, and has flowed by gravity to the base of the housing 280 and around the heating element 291, wherein this space thus constitutes the casting channels 281 for the method. After cooling, the solidified solder thus forms a continuous material element 82 which embeds the heating element 291 in the fairing material 21, thus ensuring its secure attachment and optimizing thermal conduction.

Figure 15:
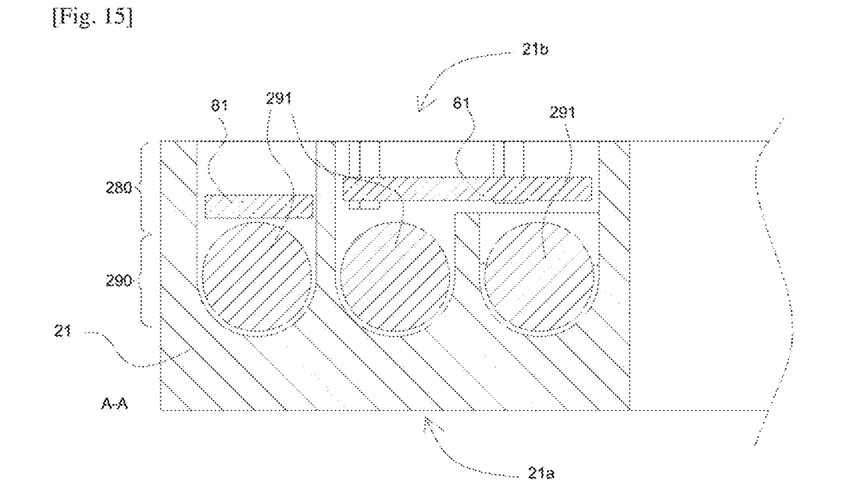

FIG. 15 illustrates an alternative arrangement for the introduction of solder, wherein said solder is introduced in the form of a continuous metal element 81. By way of an example, the groove on the left-hand side of the figure contains, above the heating element 291, a solder tape or wire in the form of a continuous element 81. A further example can be seen on the right-hand side of the figure, where a number of contiguous grooves are covered by a single continuous element, in this case a single tape or foil 81 which covers two turns of the heating element 291.

Immersion Heater

FIGS. 16 to 20 illustrate a third exemplary form of embodiment of the invention, involving an immersion heater 3 for the maintenance of the temperature of a liquid bath of molten metal. The metal may be, for example, tin, zinc, magnesium or aluminum.

For example, for the production of components by shell-mold casting or lost pattern casting, for example engine blocks, a bath of this type may be maintained continuously at 800° C., for example using two to four immersion heaters per bath, of respective power rating 10 kW to 25 kW.

Figure 16:
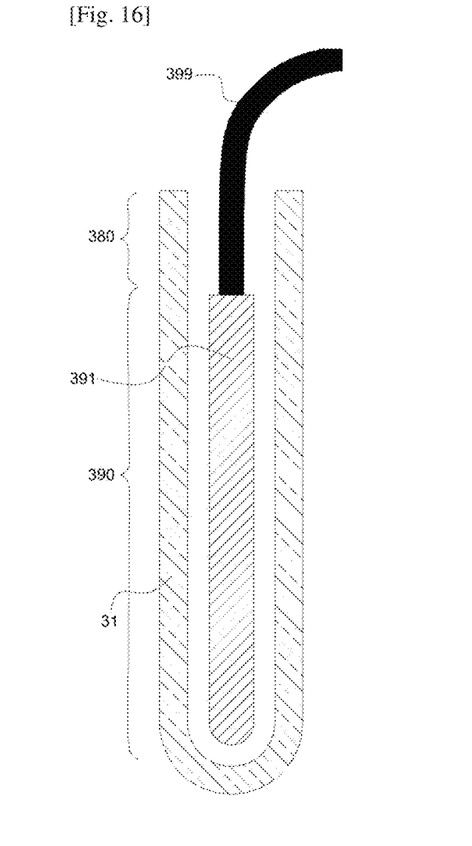
FIG. 16: illustrates a production step.

FIG. 16 shows a longitudinal section of the body 31 which constitutes a casing in the form of a thermowell, in which a linear heating element 391 has been inserted, connected by a conductor 399. The casing 31 has an interior volume in the form of, for example, a circular or oval cylinder. Over the height of the heating element, this interior volume thus constitutes the insertion channel which accommodates the heating element 391, and thus assumes the role of the housing 390 of said heating element. The upper part of the insertion channel forms the insertion opening, and extends above this heating element, thus assuming a greater volume which, in this case, constitutes the casting reservoir 380. The parts below this upper part may thus be considered to form the casting channels 381.

Figure 17:
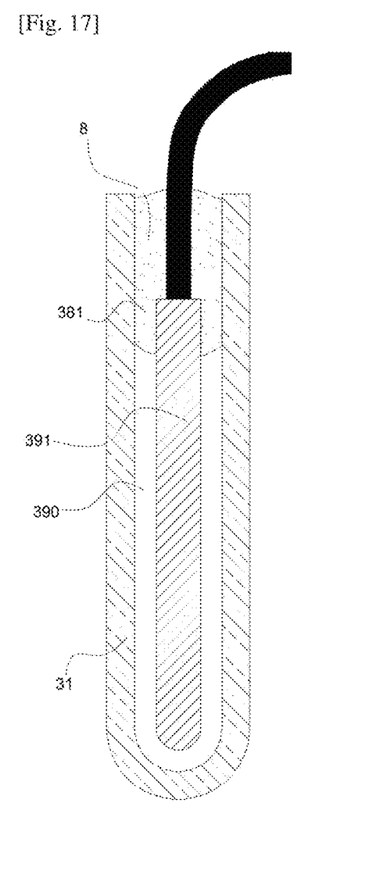
FIG. 17: shows a similar illustration of a subsequent step to FIG. 16.

As illustrated in FIG. 17, this reservoir 380 is then filled with powdered solder 8, in quantities which are calculated and tested to ensure the enclosure of the heating element.

Figure 18:
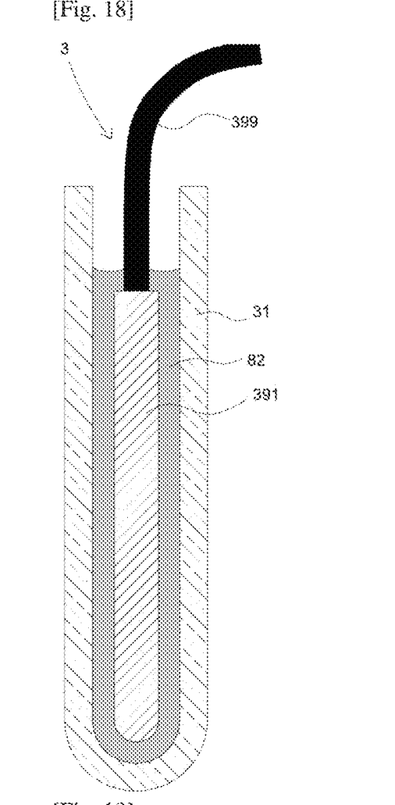
FIG. 18: shows a similar illustration of a subsequent step to FIG. 17.
Figure 19:
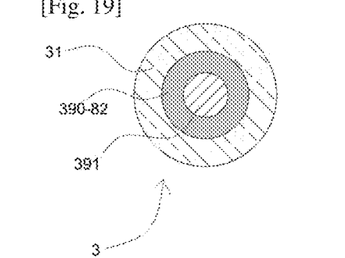
FIG. 19: shows a transverse section diagram, illustrating the immersion heater according to FIG. 18, FIG. 20: shows a transverse section diagram, illustrating the immersion heater according to FIG. 18, in a variant in which the casing comprises three heating elements.

As illustrated in FIG. 18 and FIG. 19, further to the heat-up step EC, the liquefied solder has filled the housing 390 around the heating element 391, thus constituting a continuous metal cladding 82 between the surface of the heating element 391 and the interior wall of the body 31.

Figure 20:
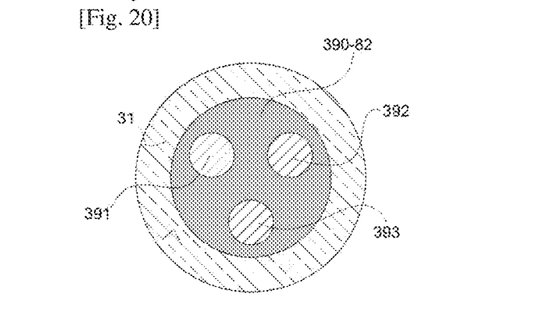

FIG. 20 illustrates a variant of an immersion heater of this type, in which a number of heating elements are arranged in a single casing 31, in this case three heating elements 391, 392 and 393 which are supplied, for example, with the three phases of a three-phase voltage. In this case, each of these is arranged in a common region of the volume, wherein this region forms the housing 390 and constitutes a common insertion channel for the heating elements. Alternatively, the housing may also be constituted by a number of distinct regions, which are entirely separate or which only communicate over part of their length, thus constituting a number of distinct insertion channels.

By the improvement of heat transfers within the immersion heater, energy efficiency is improved and the thermal gradient between the interior and the exterior is reduced, thus further permitting an improvement of the reliability and the service life of the immersion heater.

The invention claimed is:

1. A method for producing an electric heating device, or heating source, comprising at least one body which incorporates at least one housing containing at least one linear heating element formed by at least one heating resistor, said method comprising the following steps:

supplying or producing and preparing the at least one body, the at least one body comprising:
the at least one housing containing the at least one linear heating element formed by the at least one heating resistor, wherein at least one mineral-insulated cable constitutes said at least one heating resistor, and
one or more chambers constituting one or more casting reservoirs containing a pure solder material that is in a solid fragmented form or a solid monobloc form, wherein said one or more casting reservoirs communicate with said at least one housing via one or more casting channels, which are arranged to permit said solder material, once melted, to pass through said one or more casting channels, fill a space in said at least one housing surrounding said at least one heating resistor and embed said at least one mineral-insulated cable, at least by gravity and/or in response to a differential pressure; said casting reservoirs containing a quantity of solder material sufficient for filling said at least one housing around said at least one heating resistor; and heating said at least one body in a kiln to a temperature sufficient to melt said solder material, thereby resulting in a casting of melted solder material via said one or more casting channels.

2. The method as claimed in claim 1, wherein the solder material constitutes a nickel-based metal alloy from the BNi family.

3. The method as claimed in claim 1, wherein the at least one linear heating element incorporates exterior shielding formed from a stainless-steel alloy.

4. The method as claimed in claim 1, wherein the heating step comprises casting the melted solder material under a negative pressure, and under a secondary vacuum.

5. The method as claimed in claim 1, wherein the heating step comprises at least the following:
a preliminary degassing plateau, executed for at least 5 minutes at a temperature which is lower than the melting temperature of the solder material and between 700° C. and 900° C.;
a casting plateau, executed at a temperature higher than the melting temperature of the solder material and ranging from 900° C. to 1,200° C., of a duration determined in accordance with the mass to be heated, in order to achieve a temperature duration of at least 5 minutes.

6. The method as claimed in claim 5, wherein the preliminary degassing plateau is executed for at least 5 minutes at a temperature of 800° C., plus or minus 10° C.

7. The method as claimed in claim 1, wherein the solder material contained in the one or more casting reservoirs is in a powder form, in a quantity which represents a volume of powder determined as a function of a volume of each casting reservoir to be filled, at a ratio ranging from 1.2 to 2.0 times the volume to be filled.

8. The method as claimed in claim 1, wherein the solder material is in the form of at least one continuous metal part or metal foil, arranged in a volume which is situated above one or more casting channels, wherein said volume thus constitutes a casting reservoir.

9. The method as claimed in claim 1, wherein the at least one housing is produced to specific dimensions, according to dimensions of the at least one linear heating element, permitting a mutual clearance which ranges from 0.2 mm to 0.6 mm.

10. The method as claimed in claim 1, wherein the electric heating device, or heating source, produced is a heating plate for a semiconductor wafer, the heating plate comprising a body which incorporates a plurality of housings containing the at least one linear heating elements;
wherein the body comprises a flat support plate which is designed to accommodate an object to be heated, the flat support plate having a thickness in which a plurality of linear housings are formed, which receive and surround the at least one linear heating element in a substantially complementary manner;
and wherein said body incorporates the one or more casting reservoirs, which communicate with said linear housings from a position which extends transversely to the plane of said flat support plate.

11. The method as claimed in claim 10, wherein the flat support plate incorporates a functional region of an oval shape, a circular shape, or a polygonal shape, and the functional region has:
on one side, a support face which is designed to accommodate the wafer to be heated, and
on the other side, an internal face, on the surface of which a plurality of grooves are cut which are substantially concentric to the functional region and, are circular or constitute one or more spirals;
wherein the step of supplying or producing and preparing the body comprises:
inserting the at least one linear heating elements into said grooves, and
fitting and attaching on said internal face, by leak-tight welding, a counter-plate which closes said grooves, thus forming the plurality of housing which enclose said at least one linear heating elements.

12. The method as claimed in claim 11, wherein the step of supplying or producing and preparing the body includes depositing the solder material in one or more casting reservoirs which are temporarily affixed to the counter-plate, or forming a fixing base and/or infeed for conductors of the at least one heating element.

13. The method as claimed in claim 10, wherein the flat support plate is formed of a material which is selected from the group consisting of:
an austenitic stainless steel,
a martensitic stainless steel,
a type 304 or 316 or 321 or 310 stainless steel, according to the AISI standard,
a nickel-based alloy,
a nickel-chromium alloy,
a titanium metal or alloy, and
a copper-based alloy.

14. The method as claimed in claim 1, wherein the electric heating device, or heating source, produced is an immersion heater for the heating of a liquid bath of molten metal, the immersion heater comprising a body which incorporates a housing containing the at least one linear heating element;
wherein the body comprises a casing which is designed to be totally or partially immersed in the liquid to be heated, incorporating the housing in a leak-tight manner relative to said liquid;
wherein said housing incorporates one or more linear insertion channels, which receive and enclose the at least one linear heating element in a substantially complementary manner, and feature at least one insertion end for the introduction of the at least one linear heating element;
and wherein the one or more casting reservoirs are formed by the extension of said at least one insertion end, or are connected to said at least one insertion end.

15. The method as claimed in claim 14, wherein the casing comprises a shell of a ceramic base material of the silicon nitride, silicon carbide or aluminum oxide, which forms a leak-tight barrier between the one or more insertion channels and the liquid to be heated.

16. The method as claimed in claim 1, wherein the electric heating device, or heating source, produced is a faired infrared source for the execution of the welding of one or more thermoplastic parts, the faired infrared source comprising a body which incorporates a housing containing the at least one linear heating element, wherein the body comprises at least one linear or two-dimensional fairing part that incorporates one functional surface having a shape that is defined in order to produce a weld bead in a form which said heating source is intended to produce, wherein said fairing part incorporates, in a thickness, one or more linear grooves which accommodate and surround the at least one linear heating element in a substantially complementary manner;

and wherein said body comprises one or more casting reservoirs, which communicate with said at least one housing from a position which extends transversely to the plane of said flat support plate.

17. The method as claimed in claim 16, wherein the fairing part incorporates one or more grooves which surround the at least one linear heating element, on a different surface, which is an internal surface that faces in a different direction to the functional surface; and wherein the opening of said grooves receives the solder material prior to casting, such that said solder material casts into said grooves during casting, wherein said grooves thus constitute the at least one housing in which the solder material secures or embeds said at least one linear heating element.

18. The method as claimed in claim 16, wherein at least one fairing part is produced by a direct metal laser additive manufacturing process employing a cobalt-chromium alloy comprising: between 60% and 65% cobalt and between 26% and 30% chromium.

19. The method as claimed in claim 16, wherein the at least one linear heating element selected have an external diameter equal to or less than 2 mm.

20. A heating device comprising at least one body which incorporates at least one housing containing a linear heating element formed by at least one heating resistor, produced by a method comprising the following steps:

supplying or producing and preparing the at least one body, the at least one body comprising:

the at least one housing containing the at least one linear heating element formed by the at least one heating resistor, wherein at least one mineral-insulated cable constitutes said at least one heating resistor, and one or more chambers constituting one or more casting reservoirs containing a pure solder material that is in a solid fragmented form or a solid monobloc form, wherein said one or more casting reservoirs communicate with said at least one housing via one or more casting channels, which are arranged to permit said solder material, once melted, to pass through said one or more casting channels, fill a space in said at least one housing surrounding said at least one heating resistor and embed said at least one mineral-insulated cable, at least by gravity and/or in response to a differential pressure; said casting reservoirs containing a quantity of solder material sufficient for filling said at least one housing around said at least one heating resistor; and heating said at least one body in a kiln to a temperature sufficient to melt said solder material, thereby resulting in a casting of melted solder material via said one or more casting channels.

21. A heating device constituting a heating plate for a semiconductor wafer, produced by a method comprising the following steps:

supplying or producing and preparing the at least one body, the at least one body comprising:

the at least one housing containing the at least one linear heating element formed by the at least one heating resistor, wherein at least one mineral-insulated cable constitutes said at least one heating resistor, and one or more chambers constituting one or more casting reservoirs containing a pure solder material that is in a solid fragmented form or a solid monobloc form, wherein said one or more casting reservoirs communicate with said at least one housing via one or more casting channels, which are arranged to permit said solder material, once melted, to pass through said one or more casting channels, fill a space in said at least one housing surrounding said at least one heating resistor and embed said at least one mineral-insulated cable, at least by gravity and/or in response to a differential pressure; said casting reservoirs containing a quantity of solder material sufficient for filling said at least one housing around said at least one heating resistor; and heating said at least one body in a kiln to a temperature sufficient to melt said solder material, thereby resulting in a casting of melted solder material via said one or more casting channels;

wherein the body comprises a flat support plate which is designed to accommodate an object to be heated, the flat support plate having a thickness in which a plurality of linear housings are formed, which receive and surround the at least one linear heating element in a substantially complementary manner;

and wherein said body incorporates one or more casting reservoirs, which communicate with said linear housings from a position which extends transversely to the plane of said flat support plate, wherein the flat support plate comprises at least two independent heating elements.

22. The device as claimed in the claim 21, wherein the flat support plate has a support surface, and the at least two independent heating elements are at least one interior heating element, forming at least one spiral, and at least one peripheral heating element forming a circular loop or a number of spiral loops, which surrounds said at least one interior heating element in a planar arrangement, and which are parallel to the support surface of the flat support plate and mutually coplanar.

* * * * *